(12) United States Patent
Chuang

(10) Patent No.: US 6,172,388 B1
(45) Date of Patent: Jan. 9, 2001

(54) METHOD OF FABRICATING DYNAMIC RANDOM ACCESS MEMORIES

(75) Inventor: Shu-Ya Chuang, Hsinchu Hsien (TW)

(73) Assignee: United Semiconductor Corp., Hsinchu (TW)

(*) Notice: Under 35 U.S.C. 154(b), the term of this patent shall be extended for 0 days.

(21) Appl. No.: 09/270,027

(22) Filed: Mar. 16, 1999

(30) Foreign Application Priority Data

Oct. 26, 1998 (TW) .................................................. 87117657

(51) Int. Cl.[7] .................................................. H01L 27/108
(52) U.S. Cl. ............................ 257/296; 257/68; 257/71; 257/347
(58) Field of Search ............................. 257/68, 71, 296, 257/347, 306

(56) References Cited

U.S. PATENT DOCUMENTS

| | | | |
|---|---|---|---|
| 4,716,548 | * 12/1987 | Mochizuki | 257/68 |
| 4,746,959 | * 5/1988 | Mueller | 257/301 |
| 4,751,557 | * 6/1988 | Sunami et al. | 257/301 |
| 5,219,779 | * 6/1993 | Suzuki | 438/241 |
| 5,270,968 | * 12/1993 | Kim et al. | 257/369 |
| 5,447,879 | * 9/1995 | Park | 438/155 |
| 5,585,284 | * 12/1996 | Park | 438/155 |
| 5,821,564 | * 10/1998 | Wu et al. | 257/350 |

* cited by examiner

Primary Examiner—J. Carroll
(74) Attorney, Agent, or Firm—J.C. Patents; Jiawei Huang

(57) ABSTRACT

An improved method for fabricating DRAM with a thin film transistor can increase reading and writing speed. In this method, a substrate with a transfer transistor, a word line, a bit line and an interlayer dielectric layer is provided. A bit line contact and a terminal contact are formed in the interlayer dielectric layer. The bit line contact couples to the bit line and the terminal contact couples to the transfer transistor. The terminal contact is a T-shaped structure. An oxide layer is formed to cover the interlayer dielectric layer and the terminal contact to expose the bit line contact. A polysilicon layer is formed to cover the oxide layer and the bit line contact. An ion implantation step is performed to form a first doped region and a second doped region in the polysilicon layer. The polysilicon layer is patterned to make the first doped region into a source region and to make the second doped region into a drain region. The drain region is on one side of the terminal contact corresponding to the source region.

6 Claims, 4 Drawing Sheets

METHOD OF FABRICATING DYNAMIC RANDOM ACCESS MEMORIES

CROSS-REFERENCE TO RELATED APPLICATION

This application claims the priority benefit of Taiwan application serial no. 87117657, filed Oct. 26, 1998, the full disclosure of which is incorporated herein by reference.

BACKGROUND OF THE INVENTION

1. Field of the Invention

The invention relates in general to a method of fabricating high density integrated circuits, and more particularly to a method of fabricating dynamic random access memories (DRAM) with a thin film transistor (TFT) to increase the reading and writing speed.

2. Description of the Related Art

The higher the integration of memory devices is, the better the storage ability of a wafer is. In addition, the fabricating cost of a high integration memory device is cheaper than the fabricating cost of a low integration memory device. Therefore, the VLSI process usually provides as high a degree of integration as possible to increase the data storage ability of the wafer.

A conventional method of increasing the density of the memory devices of integrated circuits is to decrease part of the structure size of the memory devices of integrated circuits. This may be accomplished by a decrease in the size of the wiring lines, the size of the gate of the transistor or the size of the isolation region between memory devices. To decrease the size of the memory devices of integrated circuits means to decrease the design rules of the integrated circuits.

Generally speaking, a DRAM cell includes a transfer transistor (or a field effect transistor) and a capacitor. Conventional method of storing the DRAM data is by selectively charging or discharging each of the capacitors formed on the semiconductor substrate to store the DRAM data. That is, a two-bit data can be stored in a capacitor by using the discharging state indicated by logic "0" or the charging state indicated by logic "1". The steps of the method of storing the DRAM data includes providing electrical voltage to the gate of the transistor to store charges in the capacitor. The amount of charge stored in the capacitor depends upon the surface of the capacitor electrode, the dielectric coefficient of the dielectric layer of the capacitor and the distance between the upper electrode and the lower electrode (e.g. the thickness of the dielectric layer). The reading operation of the DRAM is performed by using the field effect transistor (FET) to selectively couple the storage capacitor to the bit line, and to transfer charges to the capacitor or retrieve charges from the capacitor. The contact formed between the bit line and the FET is one of the source/drain electrodes of the FET, and another source/drain electrode of the FET is connected to the capacitor. Accordingly, the bit line is connected to the lower electrode of the capacitor via the FET. The signal of the word line is provided from the gate of the FET to transfer the charges between the bit line and the storage capacitor.

As the size of the DRAM minimizes according to the design rule, the surface of the lower electrode of the capacitor decreases. The conventional capacitor is planar in structure. The shrinkage of the surface of the lower electrode of the capacitor thus decreases the amount of the storage charges (e.g. the capacitance). The decreasing of the amount of the storage charges will result in some problems, such as decay mechanisms and charge leakage that result in data loss. Therefore, the capacitor must frequently receive supplementary charge to maintain the amount of the storage charges in the capacitor to resolve the problem of the charge leakage or data loss. The supplementary charges to the capacitor are called refresh cycles. During refresh cycles, the DRAM cannot store or read data. If the charge storage performance decreases, it is necessary to provide a more complicated refresh cycle operation or a more sensitive charge sensor amplifier. Therefore, as the size of the DRAM minimizes according to the design rule, it is necessary that the surface of the lower electrode of the capacitor increase to overcome the problem of charge leakage or data loss.

FIGS. 1A–1C are schematic, cross-sectional views showing a conventional process of fabricating a DRAM. As shown in FIG. 1A, a shallow trench isolation (STI) structure 102 is formed on a substrate 100. A gate oxide layer 104 and a gate electrode 106 are formed on the substrate 100. A source/drain region 108 is formed in the substrate 100 and beside the gate electrode 106. An isolating layer 110, for example, an oxide layer, is formed on the gate electrode 106 and the substrate 100. The isolating layer 110 is patterned to form a contact opening 112.

As shown in FIG. 1B, a conductive layer 114 is formed on the isolating layer 110 and in the contact opening 112 to form a contact 112a that electrically connects one of the source/drain regions 108.

As shown in FIG. 1C, the conductive layer 114 is patterned to form a conductive layer 114a. A hemispherical grain (HSG) layer 115 is formed on the conductive layer 114a. Accordingly, the contact 112a, the conductive layer 114a and the HSG layer 115 together form a lower electrode of a capacitor. A dielectric layer 116 is formed on the HSG layer 115. A conductive layer 118 is formed on the dielectric layer 116 to form an upper electrode of the capacitor.

As the size of the DRAM is minimized according to the design rule, the surface of the lower electrode of the capacitor decreases. The sensitive range of the DRAM and the speed of reading or writing are all poor. It is necessary to provide a method to improve the sensitive range of the DRAM and the speed of reading or writing.

SUMMARY OF THE INVENTION

It is an object of the invention to provide a method of fabricating DRAM with a thin film transistor (TFT) to increase the reading and writing speed.

It is another object of the invention to provide a method of fabricating a DRAM with a thin film transistor (TFT). If the voltage of the charge storage is higher than the threshold voltage of the thin film transistor (TFT), the data of charging state "1" can be read correctly. Because the thin film transistor (TFT) can provide enough charges to the circuit, the sensitive range of the DRAM improves and the speed of reading and writing improves.

A method of the process according to the invention comprises the following steps. A substrate with a transfer transistor, a word line, a bit line and an interlayer dielectric layer is provided. A bit line contact and a terminal contact are formed in the interlayer dielectric layer. The bit line contact couples to the bit line. The terminal contact couples to the transfer transistor. The terminal contact is a T-shaped structure. An oxide layer is formed to cover the interlayer dielectric layer and the terminal contact and to expose the bit line contact. A polysilicon layer is formed to cover the oxide layer and the bit line contact. An ion implantation step is performed to form a first doped region and a second doped region in the polysilicon layer. The polysilicon layer is patterned to make the first doped region into a source region and to make the second doped region into a drain region. The drain region is on one side of the terminal contact corresponding to the source region.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
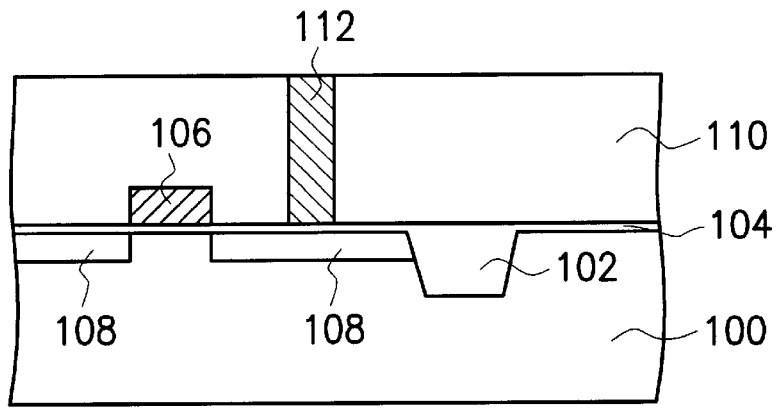
FIGS. 1A–1C are schematic, cross-sectional views showing a conventional process of fabricating a DRAM.
Figure 1B:
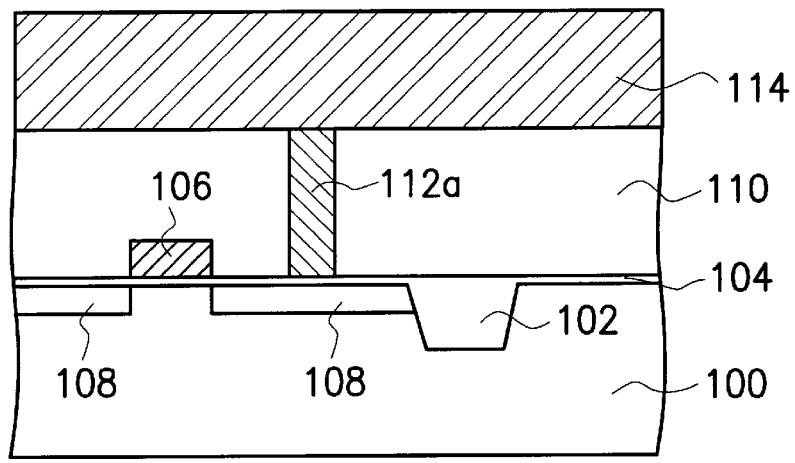
Figure 1C:
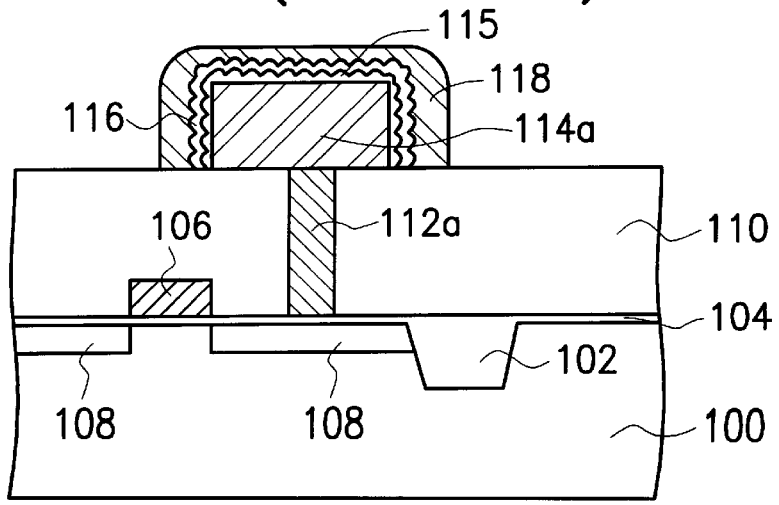
Figure 2A:
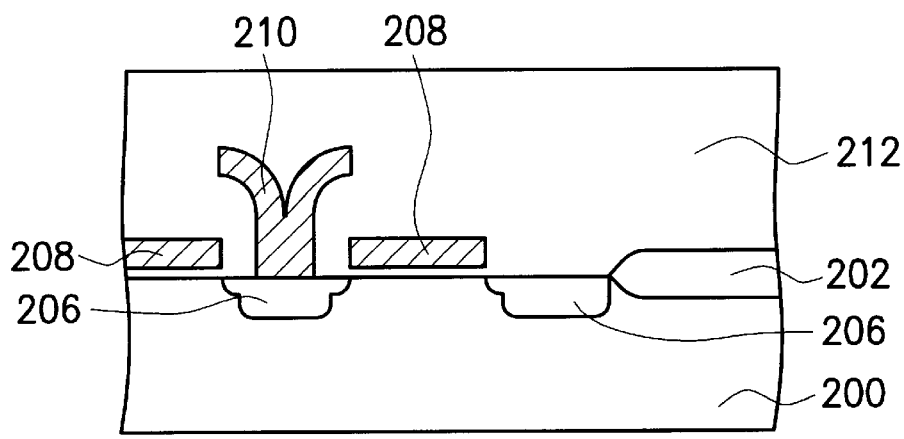
FIGS. 2A–2F are schematic, cross-sectional views showing a method of fabricating a DRAM of the present invention.

FIGS. 2A–2F are schematic, cross-sectional views showing a method of fabricating DRAM of the present invention. First, a semiconductor substrate 200 is provided. The following process of forming DRAM with a capacitor on a bit line (COB) before contact opening formed is the conventional process. A brief description is as follows. As shown in FIG. 2A, an isolation structure 202 is formed on the semiconductor substrate 200, such as STI or field oxide. A transistor is formed on the semiconductor substrate 200. The transistor includes source/drain regions 206 and a gate electrode 208. The source/drain regions 206 are conductive regions. The gate electrode 208 is a word line. A bit line 210 is form on the semiconductor substrate 200 to electrically connect the conductive regions 206. An interlayer dielectric layer 212 is formed on the isolation structure 202, the conductive regions 206, the word line 208 and the bit line 210. The preferred material of the dielectric layer 22 is silicon dioxide (SiO$_2$).

Figure 2B:
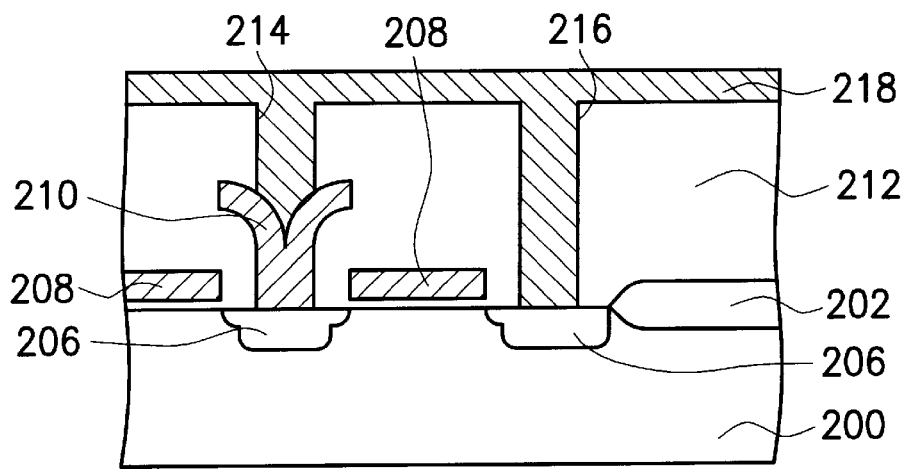

Referring to FIG. 2B, a photolithography process and an etching process are performed to form a contact opening 214 and a terminal contact opening 216 in the interlayer dielectric layer 212. The contact opening 214 exposes the bit line 210 and the terminal contact opening 216 exposes the source/drain region 206 of the transistor. A doped polysilicon layer 218 is formed on the interlayer dielectric layer 212 and fills in the contact opening 214 and the terminal contact opening 216. The doped polysilicon layer 218 is preferably 1000–2000 Å thick on the interlayer dielectric layer 212.

Figure 2C:
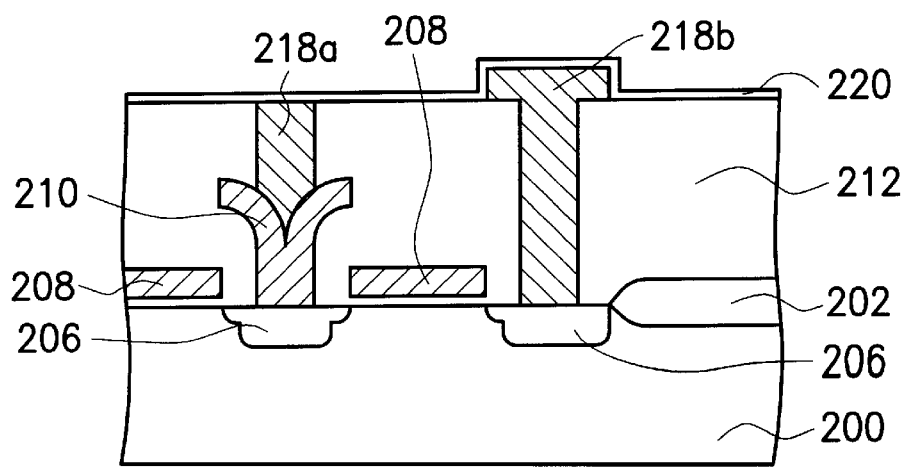

Referring to FIG. 2C, a photolithography process and an etching process are performed to pattern the doped polysilicon layer 218 and to form a bit line contact 218a and a terminal contact 218b. The bit line contact 218a is formed in the contact opening 214 and the terminal contact 218b is formed in the terminal contact opening 216 and over the interlayer dielectric layer 212. The terminal contact 218b is T-shaped for forming a gate of a thin film transistor (TFT) of the invention. Then a cleaning step is performed by using a substance such as HF to clean the exposed surfaces of the bit line contact 218a, the T-shaped terminal contact 218b and the interlayer dielectric layer 212. Then an oxide layer 220 is formed on the exposed surfaces of the bit line contact 218a, the T-shaped terminal contact 218b and the interlayer dielectric layer 212 by a process such as chemical vapor deposition (CVD). The oxide layer 220 acts as a gate oxide layer of the thin film transistor of the invention.

Figure 2D:
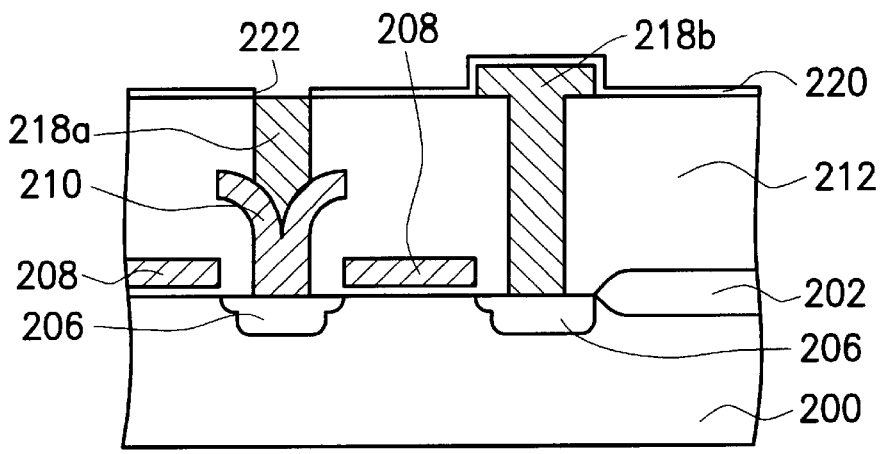

Referring to FIG. 2D, a photolithography process and an etching process are performed on the oxide layer 220 to form an opening 222 to expose the bit line contact 218a (the photomask used here is the same as the photomask used to form the bit line contact opening 214).

Figure 2E:
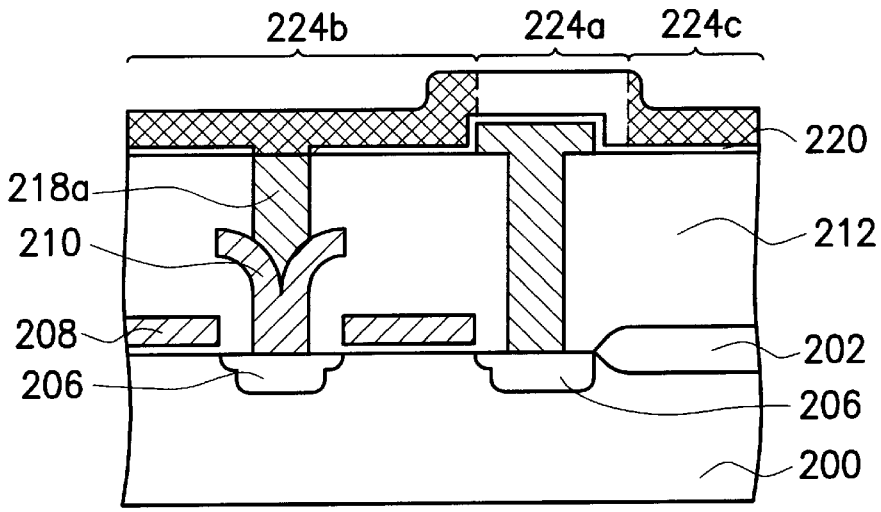
Figure 3A:
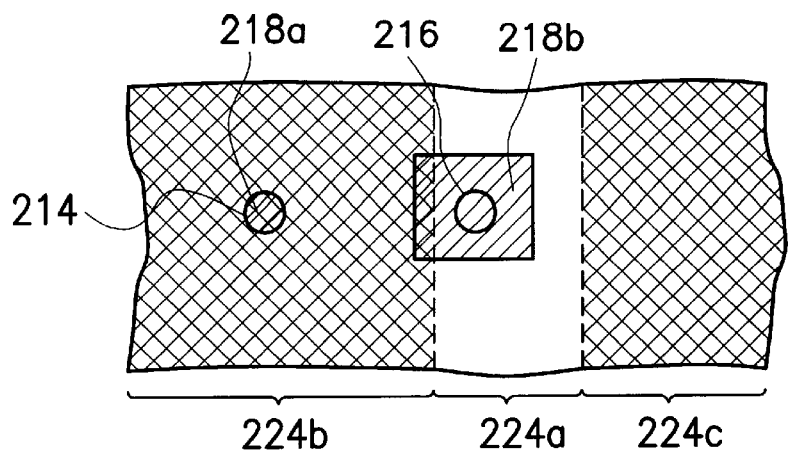
FIG. 3A is a schematic top view showing performance of an implanting step on a polysilicon layer to form source/drain regions corresponding to FIG. 2E.

Referring to FIG. 2E, a cleaning step is performed again by using a substance such as HF to clean the exposed surfaces of the oxide layer 220 and the bit line contact 218a. A polysilicon layer 224 is formed on the oxide layer 220 and the bit line contact 218a. The polysilicon layer 294 acts as the main body of the thin film transistor of the invention. Then an ion implantation step is performed to form a first doped region 224b and a second doped region 224c in the polysilicon layer 224. FIG. 3A is a schematic top view showing performance of an implanting step to form source/drain regions corresponding to FIG. 2E. An undoped polysilicon layer 224a is on the terminal contact 218b. The first doped region 224b is on the bit line contact 218a, and part of the first doped region 224b overlaps with the terminal contact 218b. The second doped region 224c is on one side of the terminal contact 218b corresponding to the first doped region 224b and has a distance from the terminal contact 218b. The first doped region 224b acts as a source region and the second doped region 224c acts as a drain region, wherein the drain region is on one side of the terminal contact 218b corresponding to the source region.

Figure 2F:
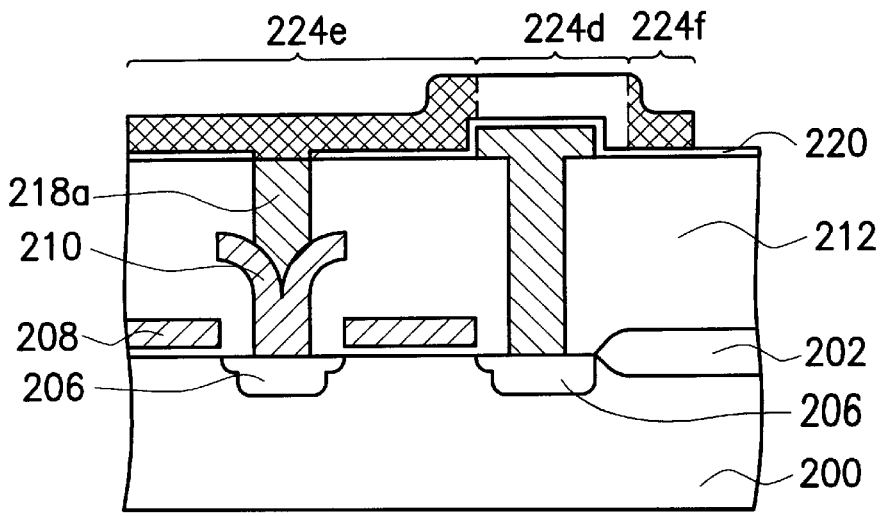
Figure 3B:
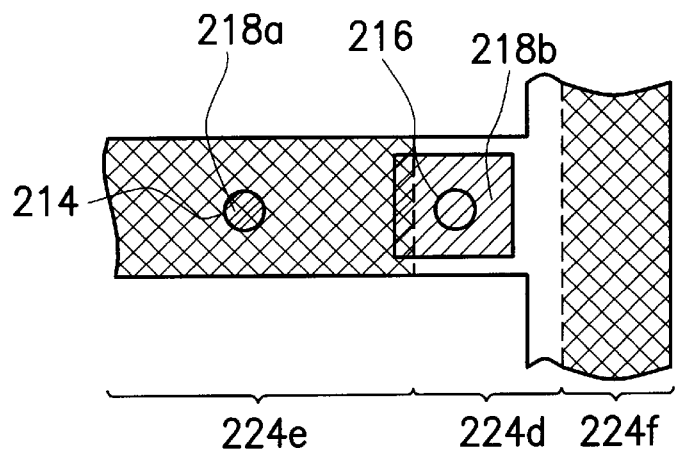
FIG. 3B is a schematic, top view showing the result of patterning the polysilicon layer corresponding to FIG. 2F.

Referring to FIG. 2F, the polysilicon layer 224 is patterned to form a reverse thin film transistor. FIG. 3B is a top view showing the results of patterning the polysilicon layer, corresponding to FIG. 2F. The drain regions of the adjacent thin film transistors are along a word line 208 and connect to form a common drain region 224f. The source regions of the adjacent thin film transistors are along a bit line 210 and connect together to form a common source region 224e. An undoped region 224d is between the common source region 224e and the common drain region 224f, and the undoped region 224d is on the terminal contact 218b.

As mentioned above, the transistor of the invention is actually a reverse thin film transistor. The storage terminal contact 218b of the DRAM acts as the gate of the reverse thin film transistor. The oxide layer 220 acts as a gate oxide layer of the thin film transistor. The DRAM and other DRAM have the common source region 224e along the direction of the bit line 210. And the DRAM and other adjacent DRAM have the common drain region 224f along the direction of the word line 208.

Figure 4:
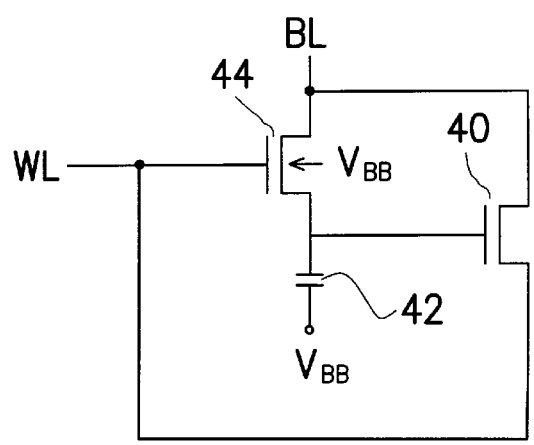
FIG. 4 is a circuit layout showing the DRAM of the present invention.

FIG. 4 is a circuit layout showing the DRAM of the present invention. The transistor 40 is a thin film transistor of the invention. The drain of the thin film transistor 40 connects to the word line (WL). The source of the thin film transistor 40 connects to the bit line (BL). The gate of the thin film transistor 40 connects to a capacitor 42. The transistor 44 is a conventional transfer transistor.

The reading operation of the DRAM of the present invention is the same as that of the prior art, while the writing operation is different from that of the prior art. During writing, the voltage on the selected word line is high, the drain voltage of the thin film transistor is high, and the voltage on the selected bit line is low. Accordingly, the drain voltage of the thin film transistor of the selected DRAM is high, and the source voltage of the thin film transistor of the selected DRAM must be lowered. If the storage terminal contact (e.g. the gate of the thin film transistor) stores data with a charging state "1", the channel of the thin film transistor is open and the source voltage of the thin film transistor will be raised. If the storage terminal contact stores data with a charging state "0", the voltage of the bit line remains at low level.

The storage terminal of the conventional DRAM usually suffers a serious current leakage problem that decreases the refresh performance, while the DRAM of the invention can eliminate the leakage current by using the thin film transistor. As long as the voltage of the storage terminal is higher than the threshold voltage of the thin film transistor, the data of charging state "1" is read correctly. At this time, the channel of the thin film transistor is open. The drain voltage of the thin film transistor and the voltage of the bit line are equal. Therefore, the DRAM of the invention provides a better sensitive range of the DRAM to improve the refresh cycle time.

In addition, the speed of writing the data of charging state "1" is also improved. Because the thin film transistor is open, the voltage can be adjusted to be equal to the voltage of the bit lines which increases the writing speed. The reading speed is thus improved. On the other hand, because the thin film transistor is open, the reading current can be as large as possible to increase the reading speed. Therefore, the DRAM of the invention is thus a high speed DRAM.

While the invention has been described by way of example and in terms of preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications, similar arrangements and procedures.

What is claimed is:

1. A DRAM formed on a substrate with a transfer transistor, a word line, a bit line and an interlayer dielectric layer, comprising:

a bit line contact formed in the interlayer dielectric layer and coupled to the bit line;

a terminal contact formed in the interlayer dielectric layer and coupled to the transfer transistor;

an oxide layer covering the interlayer dielectric layer and the terminal contact to expose the bit line contact; and a polysilicon layer covering the oxide layer, wherein the polysilicon layer includes a source region and a drain region, the source region set on the bit line contact couples to the bit line contact, and the drain region set on one side of the terminal contact corresponds to the source region.

2. A DRAM as claimed in claim 1, wherein the terminal contact is a T-shaped structure, and the terminal contact is about 1000–2000 Å thick over the interlayer dielectric layer.

3. A DRAM as claimed in claim 1, wherein the material of the bit line contact includes doped polysilicon.

4. A DRAM as claimed in claim 1, wherein the material of the terminal contact includes doped polysilicon.

5. A DRAM as claimed in claim 1, wherein part of the source region overlaps with the terminal contact.

6. A DRAM as claimed in claim 1, wherein the terminal contact, the oxide layer and the polysilicon layer together form a reverse thin film transistor (TFT).

* * * * *